(12) United States Patent
Harper et al.

(10) Patent No.: US 8,969,786 B2
(45) Date of Patent: Mar. 3, 2015

(54) OPTICAL PROXIMITY SWITCH

(75) Inventors: John Harper, Chesterbrook, PA (US); Yevgeniy Vinshtok, Downingtown, PA (US); Justin Leedy, Lebanon, PA (US)

(73) Assignee: IFM Electronic GmbH, Essen (DE)

( * ) Notice: Subject to any disclaimer, the term of this patent is extended or adjusted under 35 U.S.C. 154(b) by 346 days.

(21) Appl. No.: 13/555,471

(22) Filed: Jul. 23, 2012

(65) Prior Publication Data

US 2014/0021336 A1    Jan. 23, 2014

(51) Int. Cl.
  *H03K 17/78*    (2006.01)
(52) U.S. Cl.
  USPC .............................. 250/221; 250/229; 345/175

(58) Field of Classification Search
  CPC .................................. H04B 1/38; H04B 1/587
  USPC .......... 250/221, 216, 229, 239, 551; 345/173, 345/175; 362/276, 311.02; 359/708, 738, 359/741
  See application file for complete search history.

(56) References Cited

U.S. PATENT DOCUMENTS

| | | | | |
|---|---|---|---|---|
| 4,346,292 A | * | 8/1982 | Routt et al. | 250/216 |
| 5,103,085 A | * | 4/1992 | Zimmerman | 250/221 |
| 2005/0094392 A1 | * | 5/2005 | Mooney | 362/241 |

* cited by examiner

*Primary Examiner* — Kevin Pyo
(74) *Attorney, Agent, or Firm* — MacMillan, Sobanski & Todd, LLC (57) ABSTRACT

An optical proximity switch includes an optical transmitter for emitting a light signal, a transmitting lens with total internal reflection-using the light signal to form and transmit a light beam, a receiver, an imaging receiving lens for receiving and transmitting to the receiver the light signal, and an electronic circuit for evaluating the light signal received by the receiver.

8 Claims, 7 Drawing Sheets

OPTICAL PROXIMITY SWITCH

BACKGROUND OF THE INVENTION

1. Field of the Invention

This invention relates generally to an optical proximity switch.

2. Description of the Prior Art

Optical proximity switches are used as contactless electronic switchgear for surveillance purposes and in automation technology. They include an optical transmitter, usually a light emitting diode (LED) or laser diode, for emitting a light signal into a surveillance area, and at least one optical receiver for receiving this light signal. If an object is located in the surveillance area, the light signal is interrupted or reflected, or at least attenuated or varied in its polarization direction.

If the variation of the light signal by the object reaches an extent defined by a switching threshold, a switching signal is tripped, i.e., causing some action to take place. In addition to such binary switchgear, optical sensors output the measured variable, in particular the reflectance and/or the location of the object as an analog signal.

Switchgear of this kind is produced and sold in the most various versions, including by the present Applicant.

To define the surveillance area more precisely, but also to improve the sensitivity, both the transmitter and the receiver are provided with preferably a collimating lens. In addition to the beam formation, a critical aspect is to make optimal use of the volume available in the device.

In the past, refractive lenses of glass or plastic were preferentially used, provided with reflection-reducing coatings as needed. To save space and weight, Fresnel lenses were used. For wide-open optical s with a narrow field angle, parabolic mirrors were also used. Especially in the transmitting lenses, in contrast to the imaging lenses, crucial factors were uniform lighting, a defined field boundary, and good utilization of the beam power available. A certain lack of sharpness is even desirable here, for the sake of blurring the structure of the light-emitting surface, in particular the bonding pad usually located in the center of the chip.

U.S. patent application 2010/0085580 A1 (DE 10 2006 055 743 B4) shows an optical sensor with a lighting, comprising a plurality of elements, which has a free-form surface for varying the distribution of brightness in the transmitter spot. Besides the comparatively high cost for material, the unsatisfactory efficiency of the transmitting lens must be considered disadvantageous. Since the LED chips preferably have a Lambertian radiation pattern, only some of the radiation capacity can be captured, given the opening angles attainable with an imaging lens. At an opening ratio of 1:1.4 (opening angle 2w=40°), only approximately 66% of the radiation capacity is utilized. Approximately one-third is lost.

U.S. Pat. Nos. 5,577,492 A1 and 7,874,703 B2 disclose collimating lenses suitable for lighting purposes that have total internal reflection surfaces for deflecting the outer focused beams in the direction of the optical axis (total internal reflection lenses). Thus even light beams from the range above 40° can be used for lighting. However, then the optical imaging is largely lost, making them appear unsuitable for optical proximity switches. This is especially true whenever the geometry of the light distribution on the receiver surface is evaluated, as in proximity switches that operate on the principle of triangulation, and in one-way light gates with evaluation of the beam geometry.

U.S. Pat. No. 7,942,553 B2 shows a typical application of the aforementioned lens for lighting purposes.

SUMMARY OF THE INVENTION

An optical proximity switch includes an optical transmitter for emitting a light signal, a transmitting lens using the light signal to form and transmit a light beam and including a lens with total internal reflection, a receiver, an imaging receiving lens for receiving and transmitting to the receiver the light signal, and an electronic circuit for evaluating the light signal received by the receiver.

The optical proximity switch improves the light yield and produces uniform lighting of the object field. The structure of the light-emitting surface, in particular that of the bonding pad, should not appear in the object field.

The optical proximity switch uses the properties of the aforementioned lenses with total internal reflection (TIR), known from lighting technology, to improve the light yield and to make the light spot homogeneous. To that end, appropriate optical calculations are made, which take into account not only the projection characteristic of the chip face but also its structure, and in particular the bonding pad of the LED that usually appears as a dark spot in the middle of the light-emitting surface. The peripheral rays are used to brighten the middle.

The optical proximity switch combines a transmitting lens or lens system with a suitable imaging receiver lens such that the best possible use of the preferably circular front surface of the optical proximity switch is attained. Since with the receiving lens—it is essentially the area of the inlet pupil that is critical, the boundary of this pupil is preferably crescent-shaped, in order to nearly fill the circular front area of the two optical components. Preferably, the imaging receiver lens is a Fresnel lens.

The scope of applicability of the preferred embodiment will become apparent from the following detailed description, claims and drawings. It should be understood, that the description and specific examples, although indicating preferred embodiments of the invention, are given by way of illustration only. Various changes and modifications to the described embodiments and examples will become apparent to those skilled in the art.

DESCRIPTION OF THE DRAWINGS

The invention will be more readily understood by reference to the following description, taken with the accompanying drawings, in which.

DESCRIPTION OF THE PREFERRED EMBODIMENT

Figure 1:
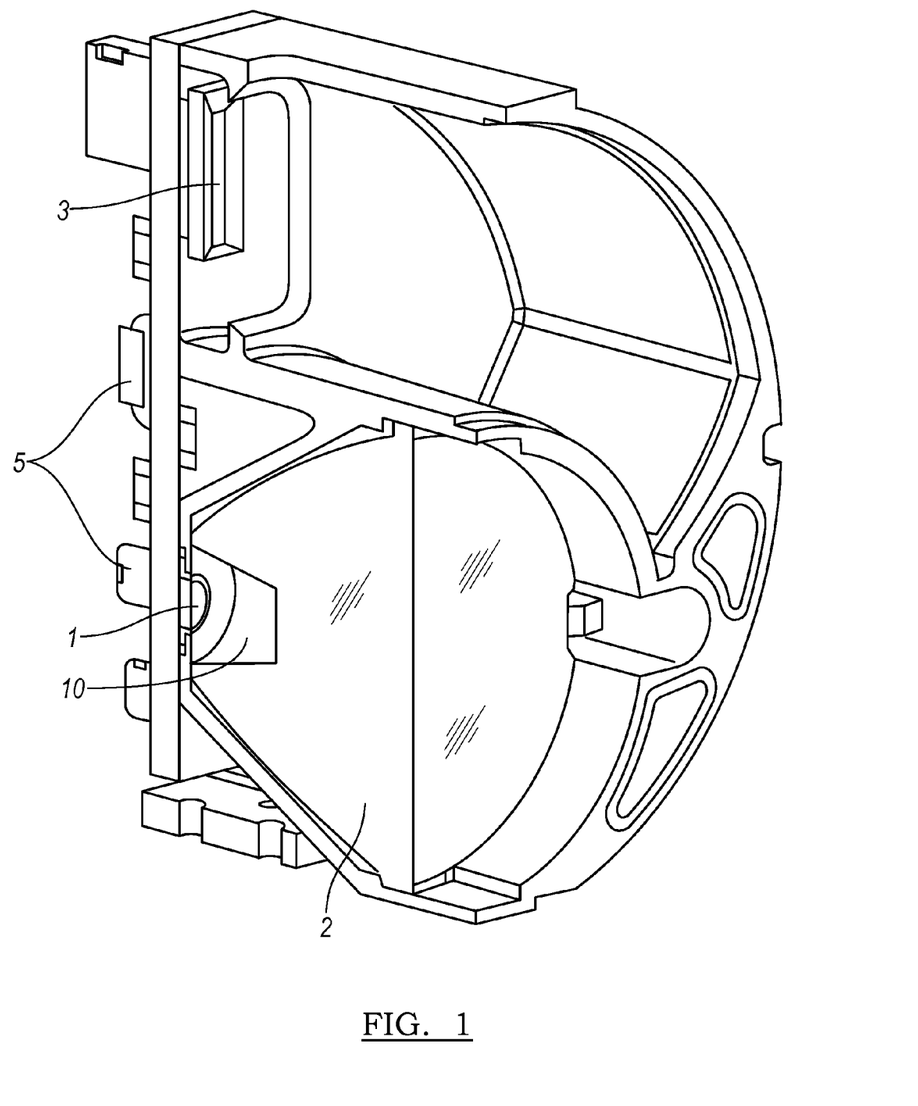
FIG. 1 includes a perspective cross section of the optical proximity switch.

FIG. 1 shows a section through the sensor region. The optical transmitter 1 and receiver 3 are located together with the electronic circuit 5 on a printed circuit board (PCB). In the vicinity of the optical transmitter 1, the transmitting lens 2 has a cylindrical recess 10. There, the transmitting lens 2 acts as a reflective collimator with an opening angle 2w=40°. The mode of operation with regard to the peripheral beams will be described in further detail in conjunction with FIG. 3.

Figure 2:
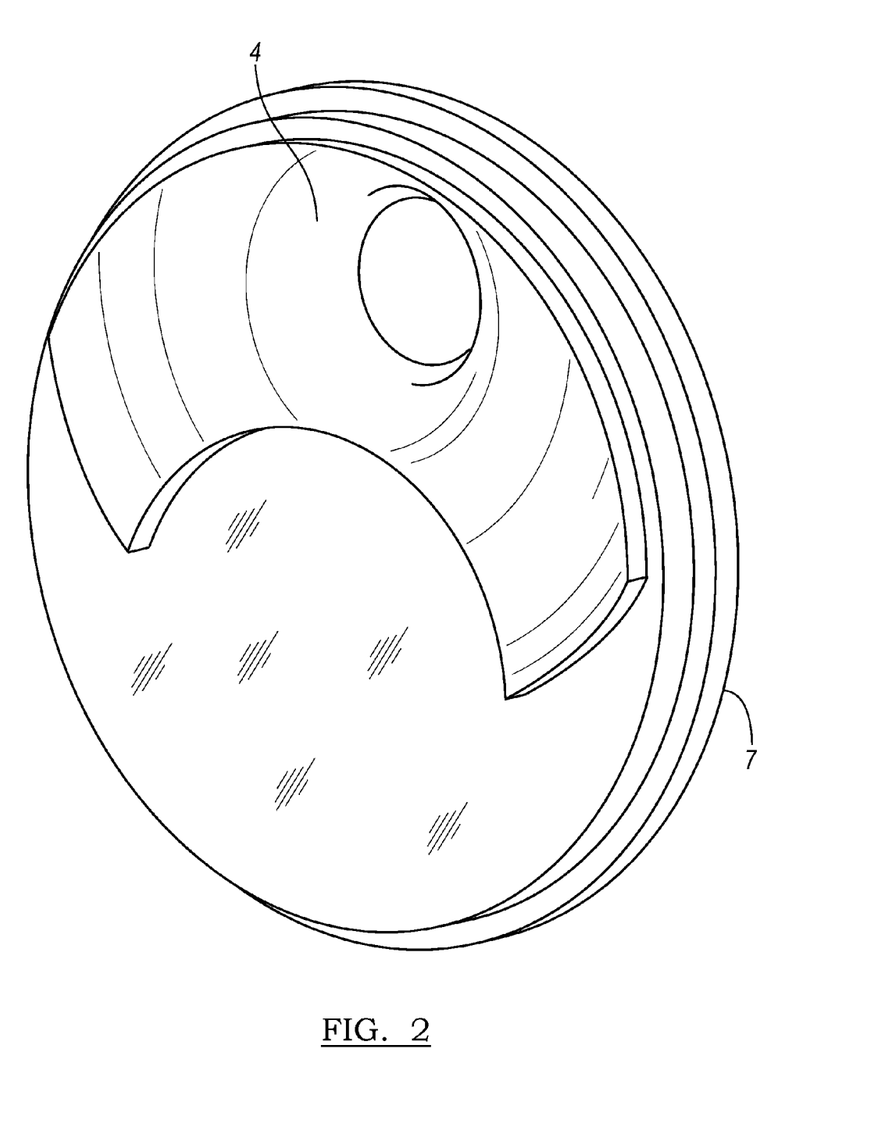
FIG. 2 includes a perspective view of the front panel FIG. 1 includes a perspective cross section of the optical proximity switch.

FIG. 2 shows the receiving lens 4 with the crescent-shaped contour for the Fresnel-optics and the circular front face 7 of the optical proximity switch.

Figure 3:
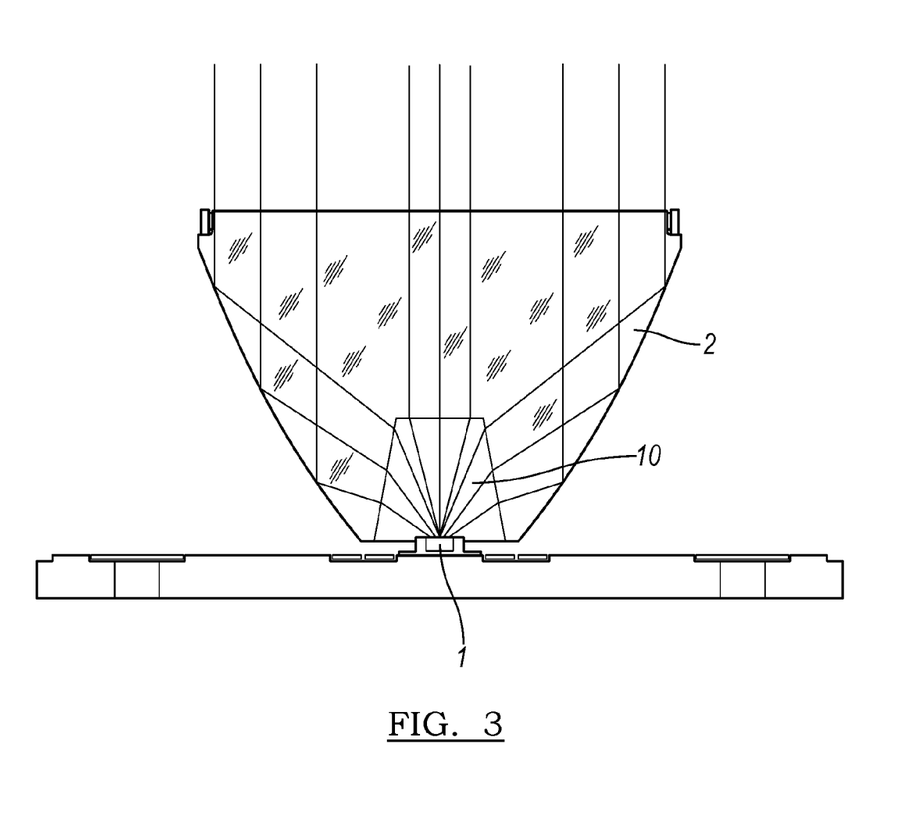
FIG. 3 is a side view of the transmitting lens.

FIG. 3 shows the mode of operation of the transmitting lens 2 in conjunction with the optical transmitter 1. For the central focused beam with an opening angle 2w<40°, the transmitting lens 2 acts as a refractive collimator. Focused beams with a larger opening angle are first refracted at the side walls of the cylindrical recess 10. Since this involves a transition from an optically thinner medium to an optically denser one, its opening angle increases. The outer contour of the transmitting lens 2 has been selected such that the limit angle for total reflection is exceeded for a large proportion of the beams, and they are deflected in the direction of the optical axis. By suitable shaping of the outer contour and appropriate focusing, the image of the bonding pad that appears as a dark spot can be compensated for completely. As has been demonstrated, this can be achieved with a lens of the C11410_LXP2-RS type, made by LEDIL, with an LS-P47F-U1AA-1-1-Z LED made by OSRAM (Osram's super red point LED).

The optical transmitting lens 2 has an FWHM (full width at half maximum) of 7° and is made of Polymethylmethacrylate (PMMA), a transparent thermoplastic often used as a glass substitute. Preferably the lens diameter is 21.6 mm at a height of 14.65 mm. The aforementioned lens 2 is also available with a holder, under the designation CA11481_LXP2-RS or FA10661_LXP-RS.

The best setting was achieved with a focusing distance of approximately 0.7 mm between the LED and the lens 2.

Figure 4:
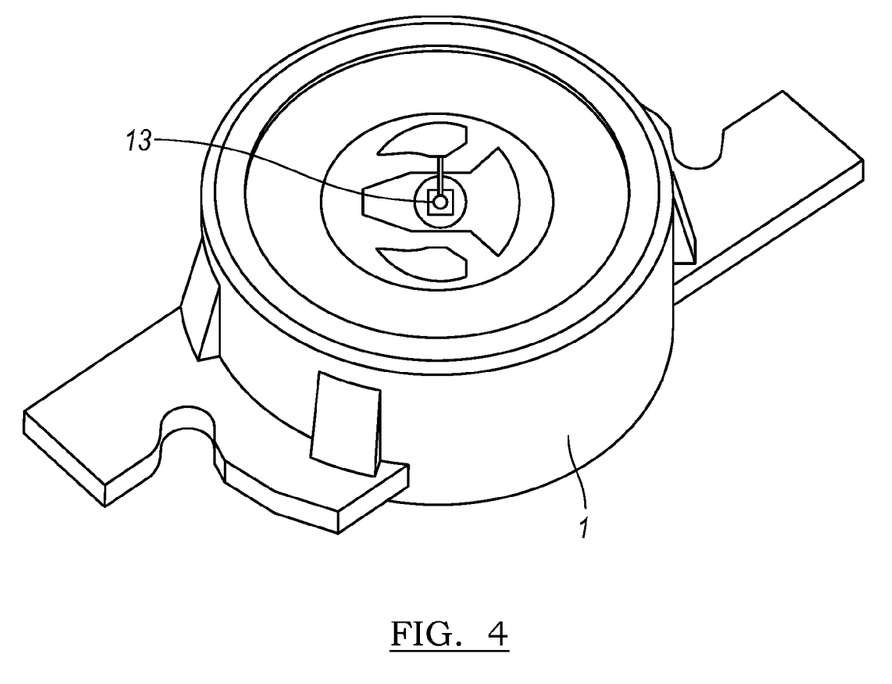
FIG. 4 is a perspective view of the optical transmitter (LED).
Figure 7:
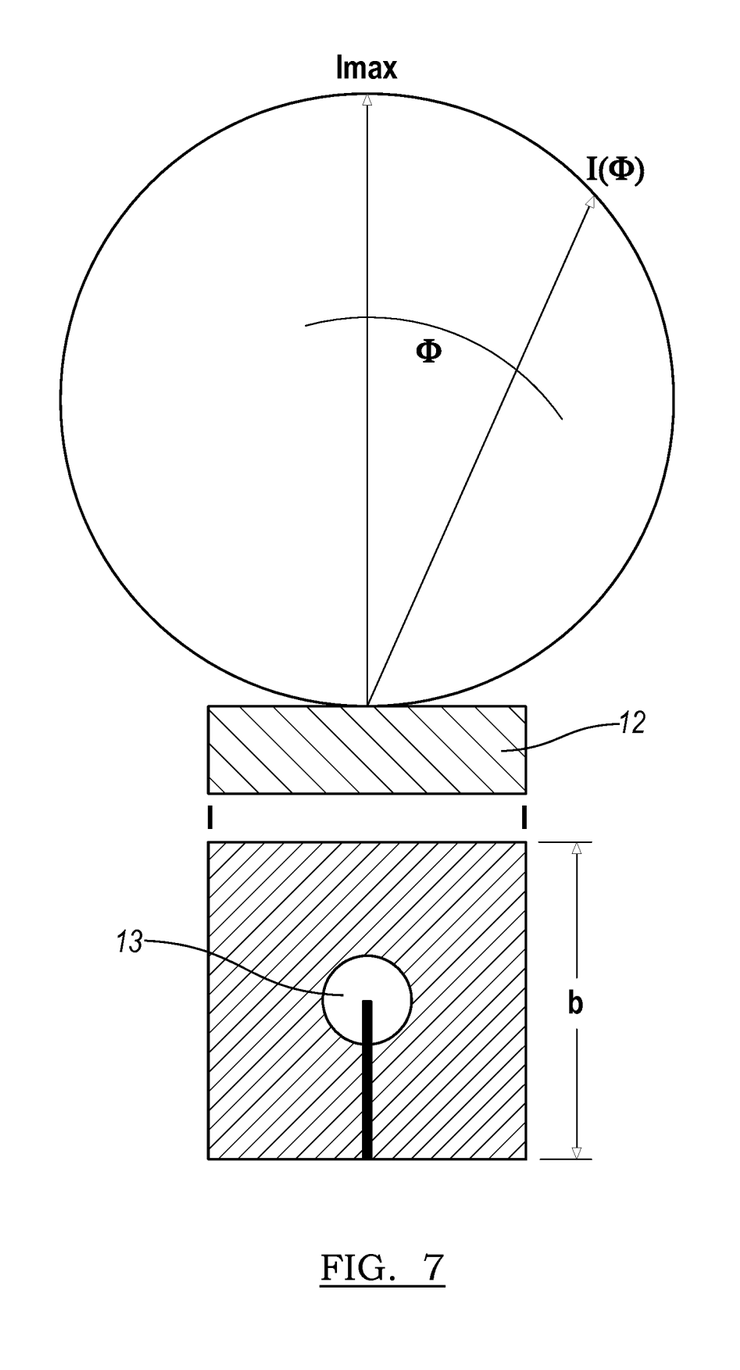
FIG. 7 is a diagram used to explain a Lambert or Lambertian emitter.

FIG. 4 shows Osram's super red point LED as optical transmitter 1 in a perspective view. The Structures 13 of the optical transmitter 1, bonding pad and bonding wire are also shown. It works as a Lambertian transmitter. More details are shown in FIG. 7.

Figure 5:
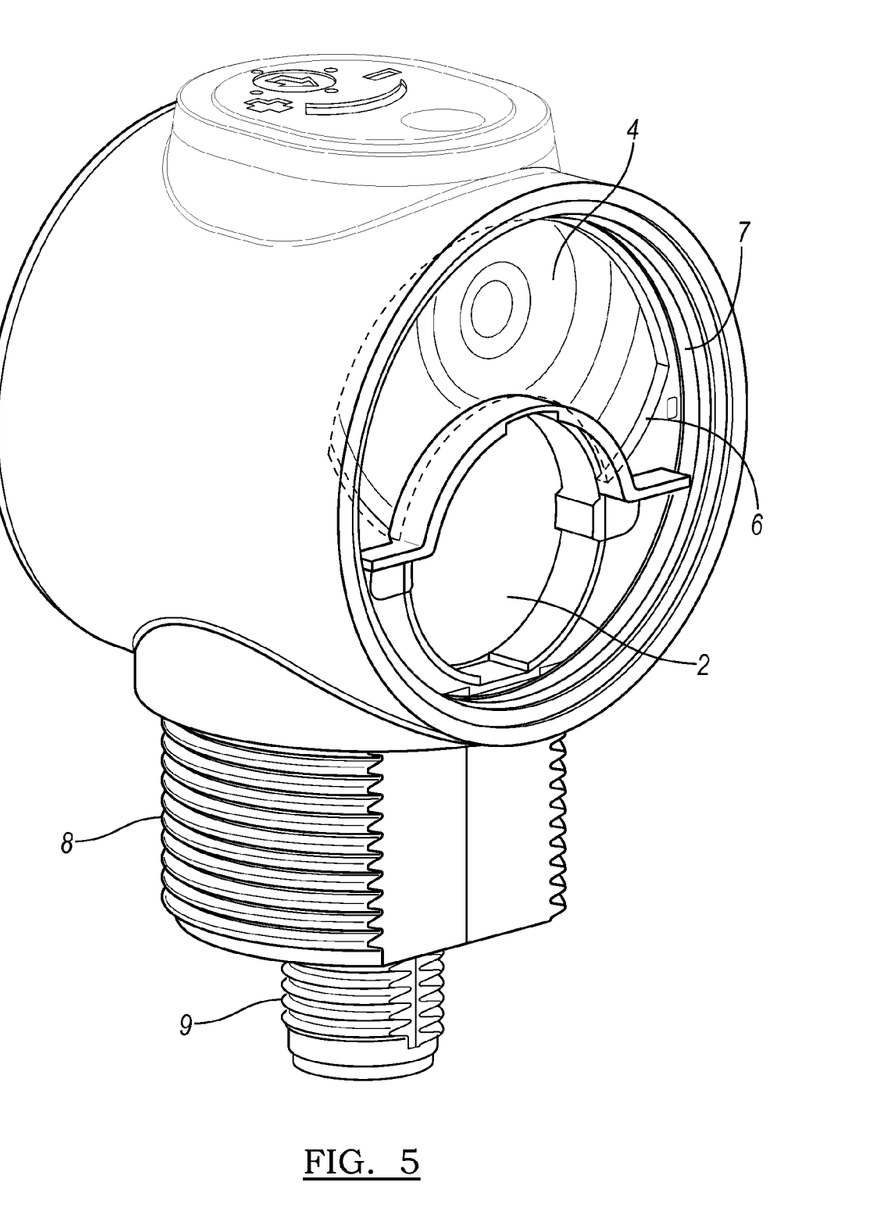
FIG. 5 is a perspective view of the entire optical proximity switch.

FIG. 5 shows the optical proximity switch. The transmitting lens 2 can be seen with a circular area of its inlet pupil. Above the transmitting lens 2 is the receiving lens 4, which preferably includes a Fresnel lens. Its crescent-shaped contour 6 is supplemented with the transmitter lens to form what is a circular front face 7 of the optical proximity switch. Thus transmitter and receiver get a short axial stood off, which is advantageous especially for reflection-type optical switches.

A 30-mm male screw thread 8 for securing the optical proximity switch to a support and a 12-mm screw thread 9 for securing a plug to the optical proximity switch can also be seen.

Figure 6:
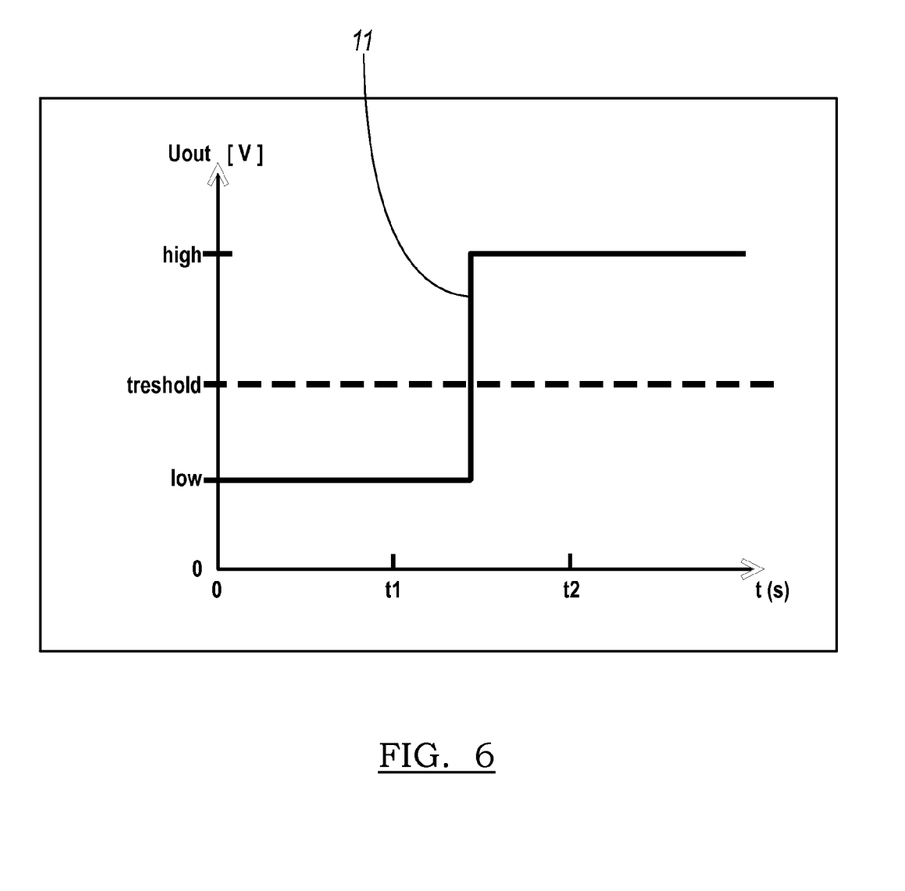
FIG. 6 is a diagram used to explain the meaning of a 'binary switching signal.'

The meaning of 'binary switching signal' is explained with reference to FIG. 6. The exit tension Uout of the optical proximity switch possesses only the two levels low or high. If the level is low, there is no object near. If the level is high, an object near is near, or vice versa.

FIG. 7 shows the operation mode of a Lambertian emitter 12. It distributes the light striking it equally in all directions. That means, the intensity follows the cosine law $$I(\Phi)=I_{max}*\cos(\Phi) \quad [1]$$

The light emitting area of the optical transmitter 1 is also shown. Its structure 13 includes bonding pad 13 and a bonding wire extending from the bonding pad.

The optical proximity switch includes a transmitter 1 for emitting a light signal into a surveillance area with a transmitting lens 2 for beam formation; a receiver 3, which can also be a location-resolving receiver with at least two subregions; an imaging receiving lens 4 for receiving the light signal; and an electronic circuit 5 for evaluating the light signal received from the location-resolving receiver 3 and for tripping a binary switching signal.

The transmitting lens 2 includes a region 10 with total internal reflection, which in combination with a Lambert emitter attains a light transmission factor of at least 71%, and which largely avoids imaging of structure of the optical transmitter 1.

The decrease in brightness in the center of the object field caused by the projection of the bonding pad is compensated for completely by total reflection of the peripheral rays, as shown in FIG. 3, and the attendant beam deflection in and by the transmitting lens 2, effectively minimizing the imaging of any chip-structure.

In an advantageous embodiment of the invention, the transmitting lens system 2 and the receiving lens system 4 are disposed side by side forming a circular contour 7. Since the transmitting lens system 2 includes a circular contour as well, the receiving lens system 4 is design in crescent-shaped form, so as to attain the largest possible reception area. Because of this spatial distribution, the receiving lens system 4 is advantageously embodied as a Fresnel lens.

LIST OF REFERENCE NUMERALS

1 Optical transmitter (LED)
2 Transmitting lens system (total internal reflection lens), collimator
3 Receiver (photodiode, photodiode cell)
4 Receiving lens system (Fresnel lens)
5 Electronic circuit for control and evaluation
6 Shape of the receiving lens system
7 Shape of the front face of the proximity switch
8 Male thread for securing the proximity switch (M30)
9 Male thread for securing a plug (M12)
10 Recess in region near the axis of the transmitting lens system 2

In accordance with the provisions of the patent statutes, the preferred embodiment has been described. However, it should be noted that the alternate embodiments can be practiced otherwise than as specifically illustrated and described.

The invention claimed is:

1. An optical proximity switch comprising:
   an optical transmitter for emitting a light signal;
   a transmitting lens including a region of total internal reflection using the light signal to form and transmit a light beam;
   a receiver;
   an imaging receiving lens for receiving and transmitting to the receiver the light signal;
   an electronic circuit for evaluating the light signal received by the receiver; and
   wherein the transmitting lens is located within a second circular area, and the receiving lens at least partially fills a crescent-shaped area portion of a first circular area that encompasses both the transmitting lens and the imaging receiving lens.

2. The optical proximity switch of claim 1, wherein the electronic circuit trips a binary switching signal as a function of the light signal received by the receiver.

3. The optical proximity switch of claim 1, further comprising:
   a Lambert emitter operatively coupled with the transmitting lens.

4. The optical proximity switch of claim 3, wherein the transmitting lens and the receiving lens are disposed side-by-side within the first circular area.

5. The optical proximity switch of claim 4, wherein the receiving lens further comprises a Fresnel lens.

6. The optical proximity switch of claim 1, wherein the receiving lens (4) further comprises a Fresnel lens.

7. An optical proximity switch comprising:
- an optical transmitter for emitting a light signal into a surveillance zone;
- a transmitting lens with total internal reflection using the light signal to form and transmit a light beam;
- a receiver;
- an imaging receiving lens for receiving and transmitting to the receiver the light signal from the surveillance zone;
- an electronic circuit for evaluating the light signal received by the receiver; and
- a Lambert emitter operatively coupled with the transmitting lens; and
- wherein the transmitting lens and the receiving lens are disposed side-by-side within a first circular area, the transmitting lens is located within a second circular area, and the receiving lens at least partially fills a crescent-shaped area portion of the first circular area.

8. The optical proximity switch of claim 7, wherein the receiving lens further comprises a Fresnel lens.

\* \* \* \* \*